United States Patent
Kehl et al.

(10) Patent No.: US 11,688,700 B2
(45) Date of Patent: Jun. 27, 2023

(54) DIE PACKAGE HAVING SECURITY FEATURES

(71) Applicant: Raytheon Company, Waltham, MA (US)

(72) Inventors: Jason M. Kehl, El Segundo, CA (US); Jason G. Milne, El Segundo, CA (US); Steve F. Mayrose, Palos Verdes Estates, CA (US); Aaron George, Los Angeles, CA (US)

(73) Assignee: RAYTHEON COMPANY, Waltham, MA (US)

( * ) Notice: Subject to any disclaimer, the term of this patent is extended or adjusted under 35 U.S.C. 154(b) by 7 days.

(21) Appl. No.: 17/345,518

(22) Filed: Jun. 11, 2021

(65) Prior Publication Data

US 2022/0399290 A1    Dec. 15, 2022

(51) Int. Cl.
| | | |
|---|---|---|
| H01L 23/043 | (2006.01) | |
| H01L 23/58 | (2006.01) | |
| H01L 23/552 | (2006.01) | |
| H01L 23/46 | (2006.01) | |
| H01L 23/13 | (2006.01) | |
| H01L 23/498 | (2006.01) | |
| H01L 23/538 | (2006.01) | |
| H01L 23/04 | (2006.01) | |
| H01L 23/16 | (2006.01) | |
| H01L 23/00 | (2006.01) | |

(52) U.S. Cl.
CPC .......... *H01L 23/573* (2013.01); *H01L 23/043* (2013.01); *H01L 23/46* (2013.01); *H01L 23/552* (2013.01); *H01L 23/585* (2013.01)

(58) Field of Classification Search
CPC ..... H01L 23/573; H01L 23/043; H01L 23/46; H01L 23/552; H01L 23/585
See application file for complete search history.

(56) References Cited

U.S. PATENT DOCUMENTS

| | | |
|---|---|---|
| 7,608,919 B1 | 10/2009 | Bernstein et al. |
| 8,674,515 B2 | 3/2014 | Farooq et al. |
| 9,064,849 B2 | 6/2015 | Zhu |
| 9,362,139 B2 | 6/2016 | Ebefors et al. |
| 10,242,967 B2 | 3/2019 | Drab et al. |
| 10,508,030 B2 | 12/2019 | Katkar et al. |
| 10,509,752 B2 | 12/2019 | Schreiber et al. |
| 2015/0162307 A1* | 6/2015 | Chen ....................... H01L 23/04 438/107 |
| 2018/0374776 A1* | 12/2018 | Liu ...................... H01L 23/3675 |
| 2019/0348340 A1* | 11/2019 | Kwon ................ H01L 23/3675 |
| 2020/0075503 A1* | 3/2020 | Chuang .............. H01L 23/5383 |
| 2020/0343218 A1* | 10/2020 | Hu ......................... H01L 23/562 |
| 2021/0398944 A1* | 12/2021 | Shekhar ............... H01L 23/427 |

* cited by examiner

*Primary Examiner* — Omar F Mojaddedi
(74) *Attorney, Agent, or Firm* — Daly Crowley Mofford & Durkee, LLP

(57) ABSTRACT

Methods and apparatus for providing an assembly including a base substrate, a lid substrate, and a ring frame between the base substrate and the lid substrate to define a protected volume, where the ring frame includes through vias. A die may be contained in the protected volume. Sensor circuitry can include conductive pillars in the protected volume and the die can include circuitry to determine an impedance of the pad and the pillars for tamper detection. An edge cap can be coupled to at least one side of the assembly for tamper detection.

19 Claims, 20 Drawing Sheets

US 11,688,700 B2

DIE PACKAGE HAVING SECURITY FEATURES

BACKGROUND

As is known in the art, through silicon vias (TSVs) can be used to achieve multilayer three-dimension (3D) integrated circuits (ICs), which may shorten the length of interconnects to improve circuit speeds, reduce power consumption, and increase system storage bandwidth.

Conventional 3D IC integration is provided by a combination as plurality of wafers where device layers are interconnected vertically by TSVs. With the application of 3D ICs, the size of TSVs is scaled and the silicon layer is thinned. When forming TSVs, a metal material is used to fill a hole to provide a layer-to-layer conductive path.

SUMMARY

Embodiments of the disclosure provide microelectronic packaging to reduce overall package footprint, maintain thermal stability, and/or provide security features. In some embodiments, a circuit package includes multi-layer substrate levels, such as silicon, that support wafer-level functionality and system interconnect. In some embodiments, a system comprises Si, Cu, and solder for thermal performance and structural robustness. It will be appreciated that a vertical layer structure allows for a smaller footprint in the X and Y directions in comparison with conventional package structures. Vertical interconnects utilizing through silicon vias (TSVs) in a multi-level package can provide a protected internal volume that achieves advantageous security features.

In an aspect, an assembly can include a base substrate; a lid substrate; a ring frame between the base substrate and the lid substrate to define a protected volume, wherein the ring frame includes through vias; and a die contained in the protected volume.

An assembly or a method can further include one or more of the following features: electronic capacitive, resistive, and/or impedance-based sensor circuitry in the protected volume, conductive particles form part of the sensor circuity, conductive pillars form part of the sensor circuitry, the pillars extend from a pad supported by the base substrate, the pad is coupled to the die, the die comprises circuity configured to determine an impedance of the pad and the pillars, at least one of the vias in the ring frame has exposed via material conductive coupled with at least one of the pillars, the pillars are formed from conductive particles in an anisotropic adhesive, the pillars have heights defined by a mechanical fillet, the pad and the pillars define an impedance fingerprint to detect tampering, deconstruction of the assembly causes at least some of the pillars to break, at least some of the through vias in the ring frame have conductive material exposed on an outer surface of the ring frame, and further including at least one edge cap coupled to at least one side of the assembly, wherein the at least one edge cap comprises a conductive trace in electrical contact with the exposed conductive material of at least one of the vias, edge caps surround the assembly, the edge caps form an electronic sensing circuit which enables the assembly to detect tampering, the die is configured to detect a discontinuity in the edge cap electronic sensing circuit or barrier, the assembly comprises at least three layers of the base substrate and the ring frame, the edge caps increase connections from layer-to-layer, the edge cap includes fluid channels to enable coolant flow, and/or a conducive mesh around a perimeter of the ring frame.

In another aspect, a method includes employing an assembly that can include a base substrate; a lid substrate; a ring frame between the base substrate and the lid substrate to define a protected volume, wherein the ring frame includes through vias; and a die contained in the protected volume.

BRIEF DESCRIPTION OF THE DRAWINGS

The foregoing features of this disclosure, as well as the disclosure itself, may be more fully understood from the following description of the drawings in which.

DETAILED DESCRIPTION

Figure 1:
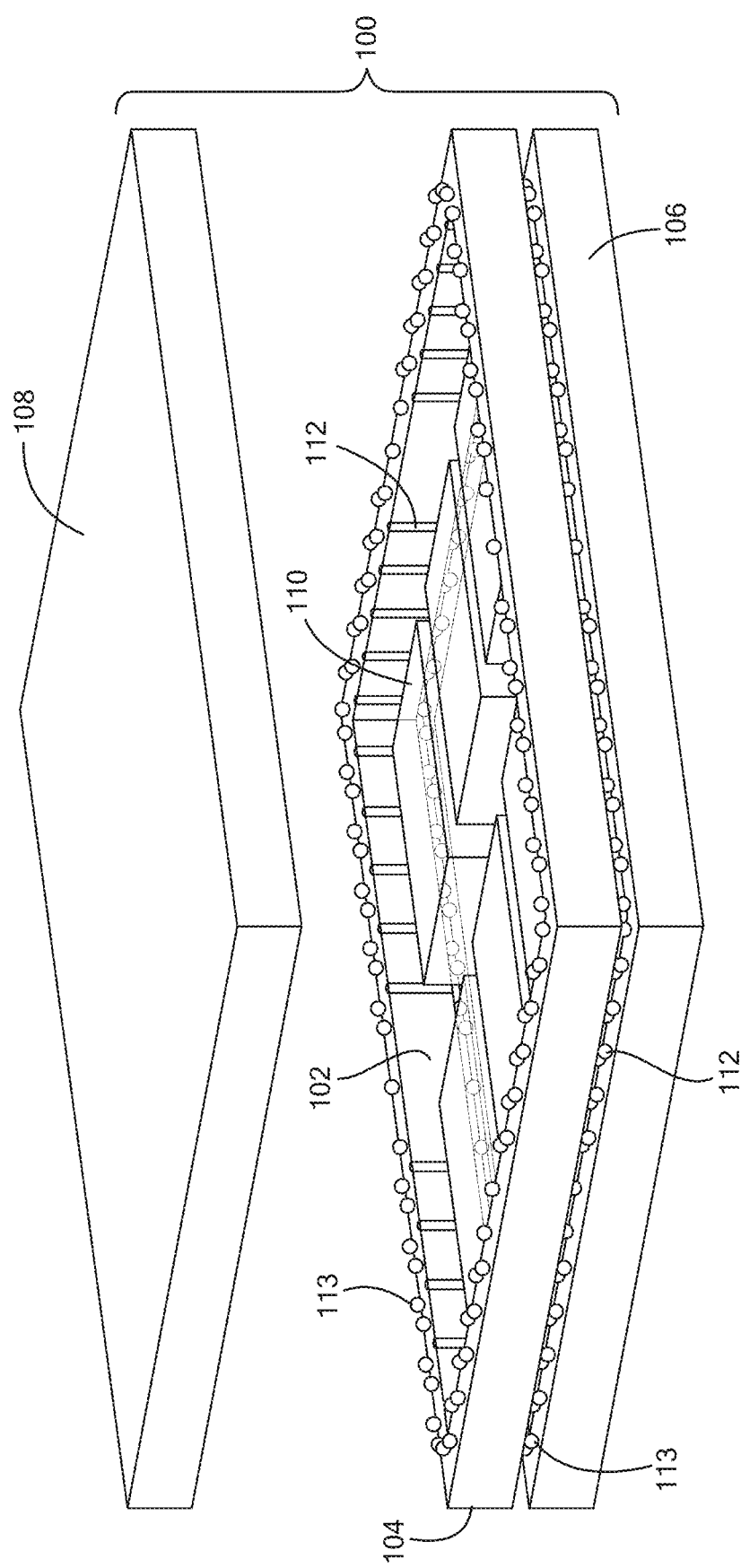
FIG. 1 is a partially exploded isometric view of a die package having security features in accordance with example embodiments of the disclosure.

FIG. 1 shows an example IC package 100 having a protected volume 102. In an example embodiment, a frame 104 is between a base substrate 106, such as a die, and a lid substrate 108, such as a die. One or more circuit die 110 having circuitry can be supported by the base die 106 within the protected volume 102.

In some embodiments, the ring frame 104 can comprise an integral structure. In other embodiments, ring frame components can be secured together to form the ring structure. The ring frame 104 can comprise any suitable material, such as silicon.

In embodiments, a series of vias 112, such as TSVs, are formed in the ring frame 104 to provide connections from the circuit die to another location. The vias 112 comprise a conductive material, such as copper, filling a cavity. The vias 112 can be located throughout the ring frame 104. In some embodiments, the vias 112 can have exposed conductive material on an interior and/or exterior surface of the ring frame to provide various security features, as described more fully below. Solder balls 113 can provide a connection to a top and/or bottom of the vias 112.

Figure 1A:
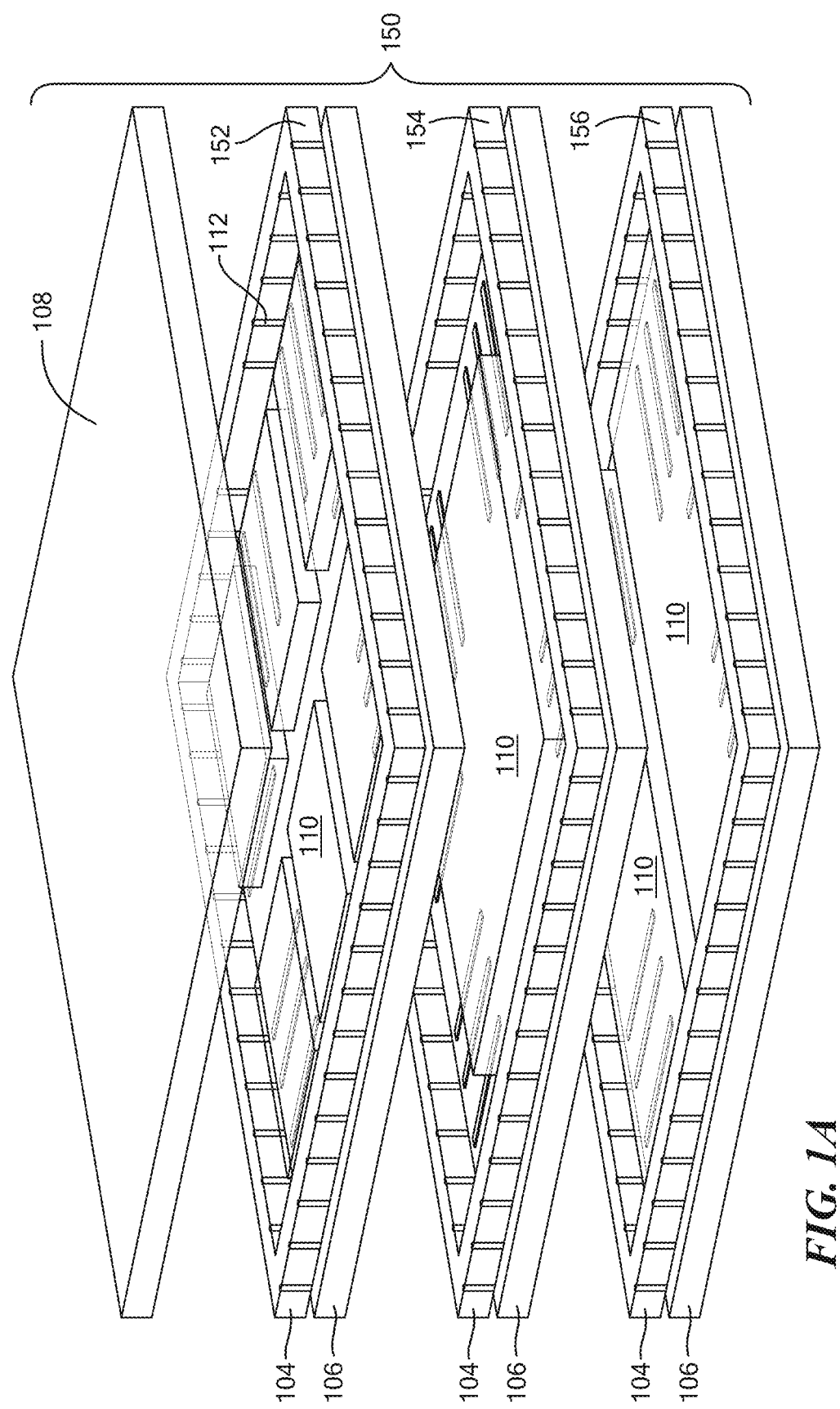
FIG. 1A is a partially exploded isometric view of a further die package having security features in accordance with example embodiments of the disclosure.
Figure 1B:
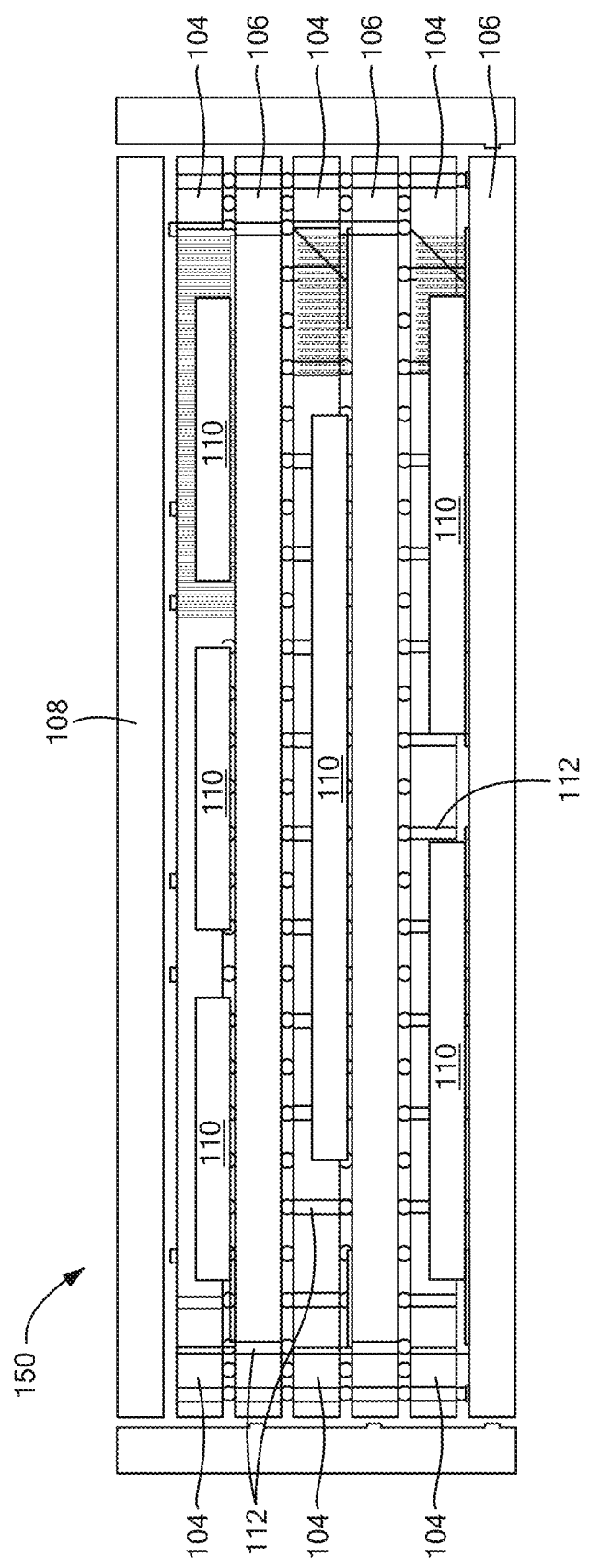
FIG. 1B is a cross-sectional view of the die package of FIG. 1A.

FIG. 1A is a partially exploded view and FIG. 1B is a cross-sectional view of a multi-level package 150 having alternating stacked layers of base die 106 and ring frames 104 that provide respective protected volumes for circuit die 110. TSVs 112 in the ring frames 104 provide layer to layer connections.

It is understood that the various levels of the package 150 can contain any type and any practical number of die having circuitry to perform functionality to meet the needs of a particular application. For example, a first level 152 can comprise memory die, a second level 154 can comprise an FPGA die, and a third level 156 can comprise a processor die. The TSVs 112 can provide electrical connections between the levels 152, 154, 156.

FIGS. 2A-E show a portion of a circuit package 200 having vias 202, such as TSVs, formed in a ring frame 204. In the illustrated embodiment, some of the TSV material 202 is exposed on an interior surface 206 of the ring frame 204.

Within a protected volume 208, a series of conductive pillars 210 can be formed in a material 211, such as an anisotropic material. It is understood that FIGS. 2D and 2E show the material 211, which is transparent in FIGS. 2A and 2B.

In the illustrated embodiment, the pillars 210 are shown as being substantially vertical. The pillars 210 can extend from a pad 212 supported by a base die 214 in an area between a circuit die 216 and the ring frame 204. In the illustrated embodiment, the tops of the pillars 210 form an angle corresponding to an angled fillet extending from proximate a top of the ring frame 204 down to the base substrate.

In embodiments, connections to the die, vias, and other circuit components can be made using solder bumps 219 or other suitable technique.

Figure 3A:
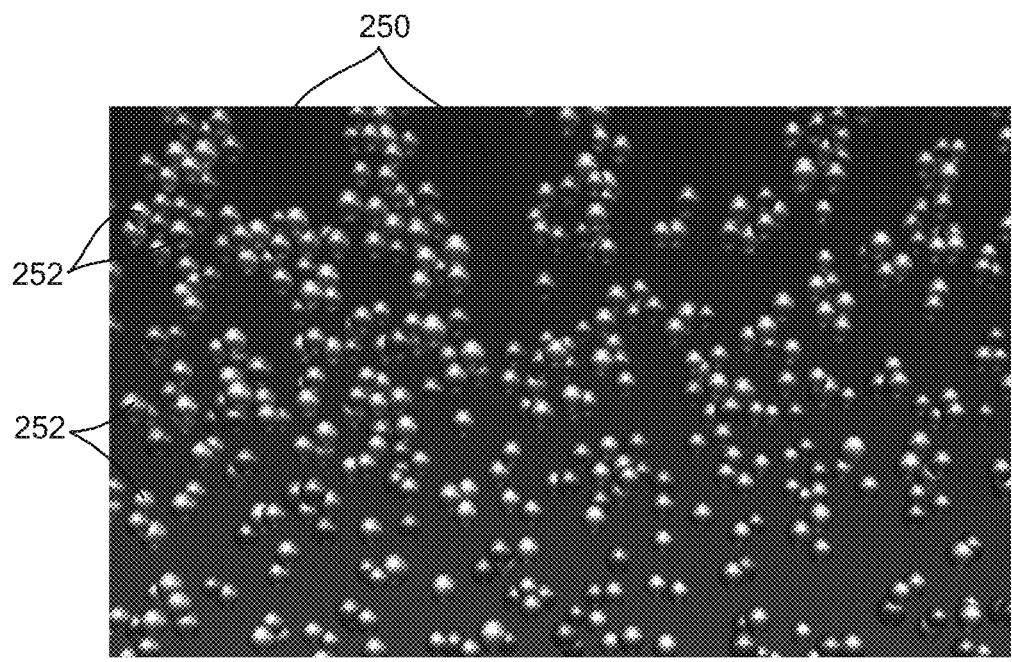
FIG. 3A is a pictorial representation of an anisotropic adhesive in an initial state.

In an example embodiment, the pillars 210 are formed from an anisotropic adhesive 211. In an initial state shown in FIG. 3A, an anisotropic adhesive has conductive particles 252 suspended in a liquid adhesive material 250.

Figure 2A:
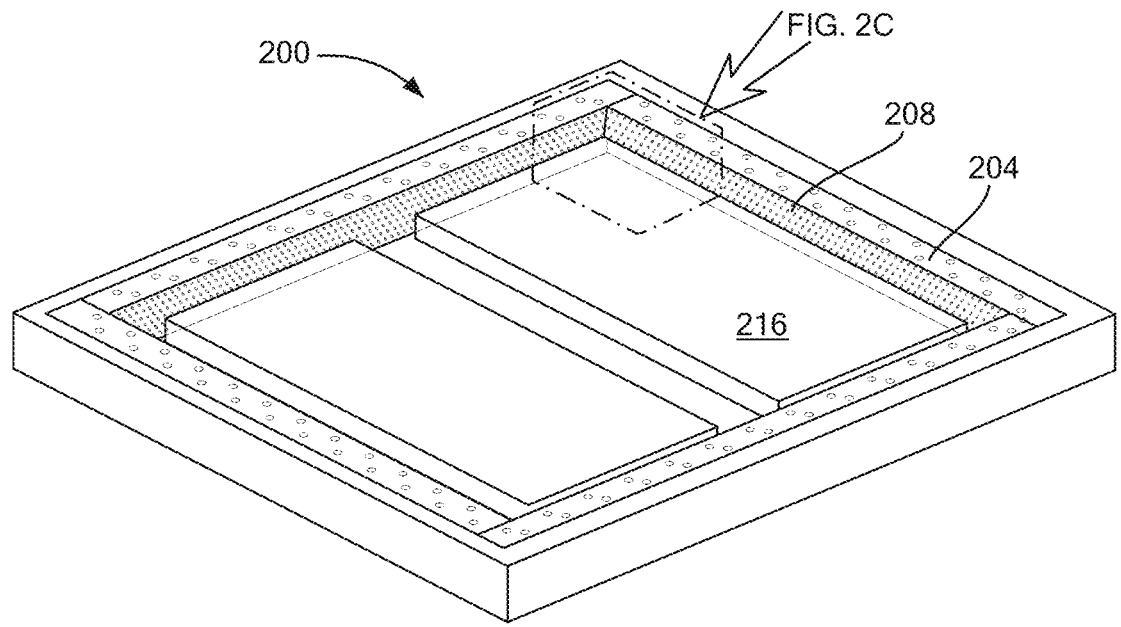
FIG. 2A is an isometric view of a portion of a die package having security features in accordance with example embodiments of the disclosure.
Figure 2B:
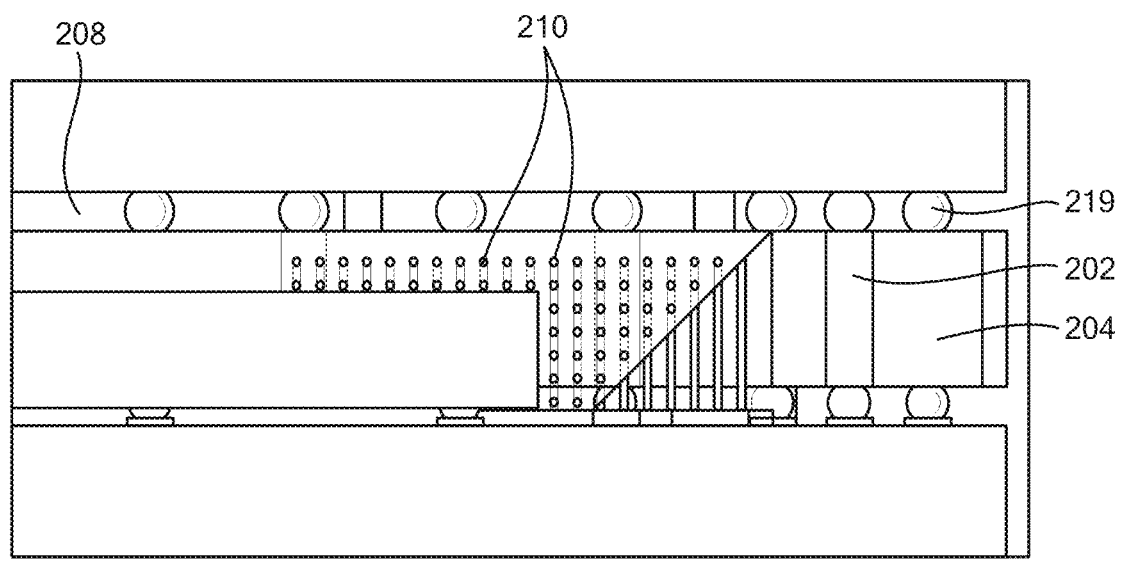
FIG. 2B is a cross-sectional view showing further details for the die package portion of FIG. 2A.
Figure 2C:
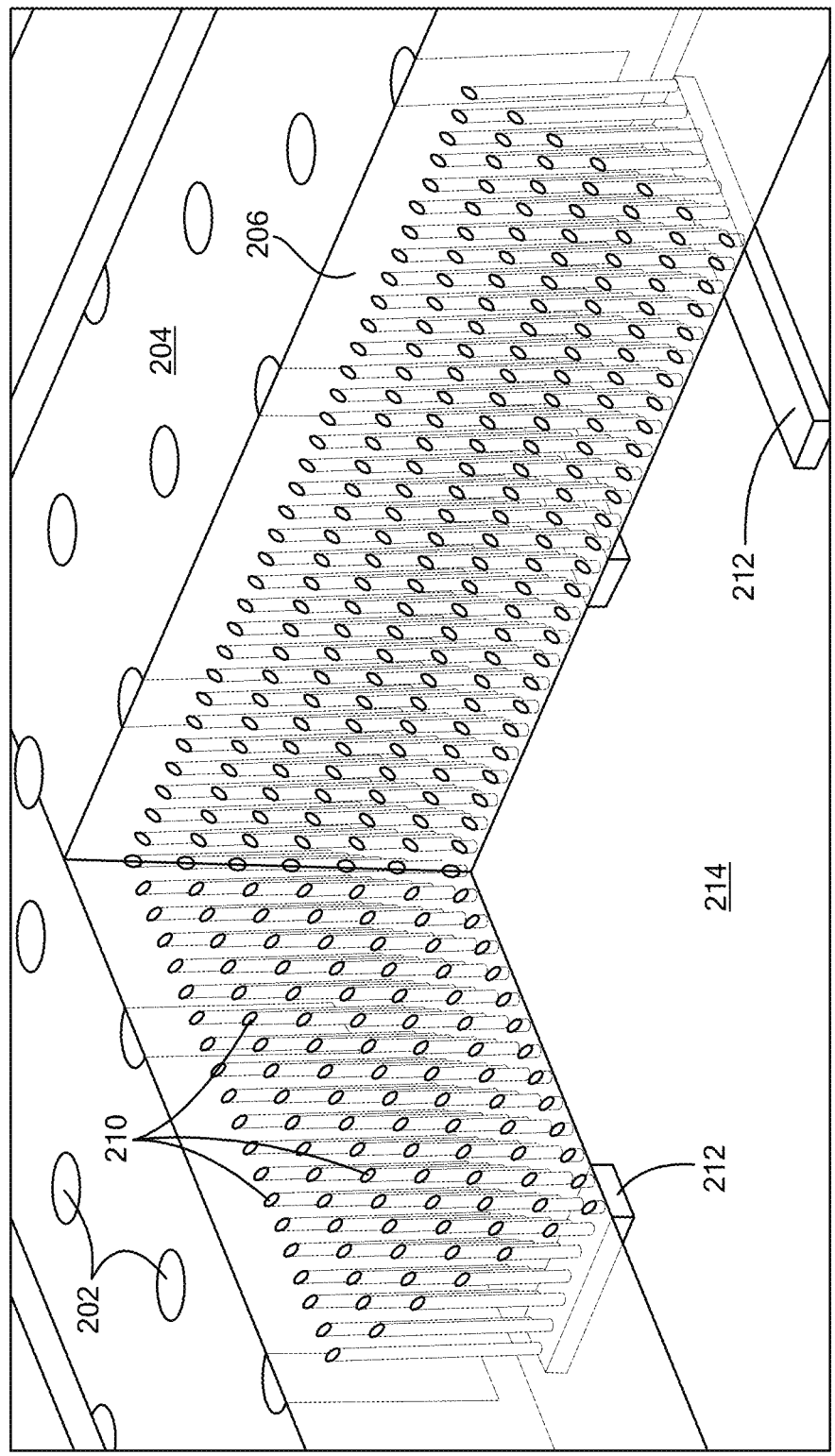
FIGS. 2C and 2E are isometric views showing further details for the die package portion of FIG. 2A.
Figure 3B:
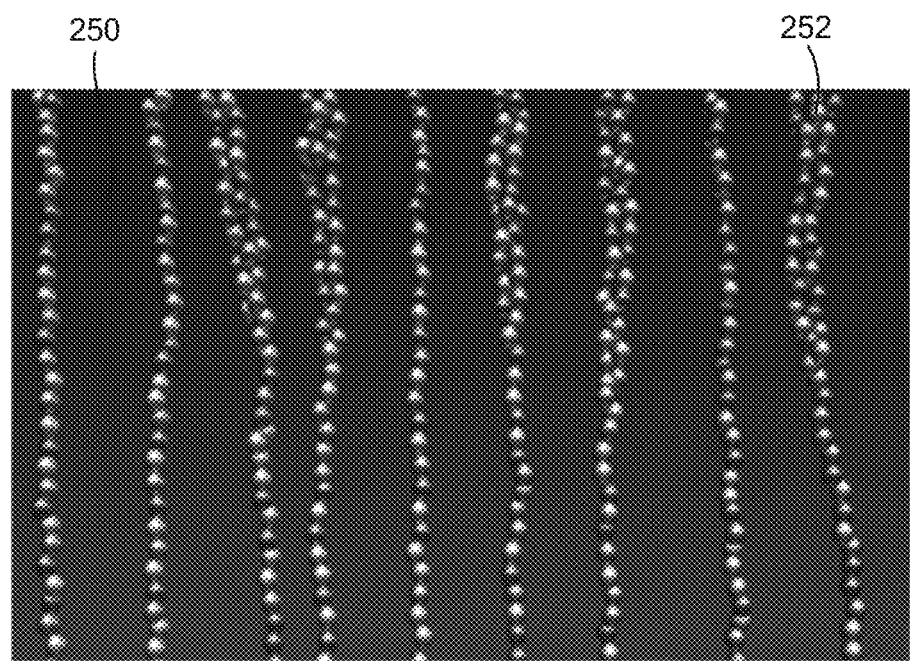
FIG. 3B is a pictorial representation of the anisotropic adhesive of FIG. 3A after application of a magnetic field to form columns of conductive particles in the adhesive.

In one embodiment, a magnetic field is applied to the anisotropic adhesive containing conductive particles to form columns or other geometric structures within the epoxy resin, as shown in FIG. 3B. As the adhesive cures, the conductive particles form pillars or other geometric structures 210 (FIG. 2A-2C) of conductive material. It is understood that using one or more magnetic fields to form columns of conductive particles in an anisotropic adhesive is known in the art. It is also understood that using epoxy materials that are pre-loaded with pillars or vertically oriented conductors which make electrical contact through the epoxy resin upon cure is known in the art.

It will be appreciated that in conventional applications of anisotropic adhesive, two contact surfaces are compressed to trap conductive particles that form an electrical connection in one axis.

It is understood that the pillars can be formed using any suitable technique. It is further understood that the pillars can have any practical geometry that provides suitable impedance characteristics, as described below. For example, the pillars may have the same height or different heights. Pillars can be formed in a uniform array or can be randomly located. Pillar thickness can be uniform or non-uniform. Other such variations will be readily apparent to one of ordinary skill in the art.

Referring again to FIGS. 2A-2C, the sets of pillars 210 extend from respective pads 212 that can be connected to the die. Circuitry in the die can measure impedance between pads 212 having attached pillars 210. While the impedance measurement does not require exposed TSV, the exposed TSV allows determination if the ring frame has been disturbed or if the package has been taken apart. The exposed TSVs allow monitoring of the capacitance in a perpendicular orientation (e.g., from pad to exposed TSV) rather than only a planar pad to pad orientation. In addition, the exposed TSV enables connection in at the mid-thickness of the ring frame providing additional security.

In embodiments, at least some of the pillars 210 are proximate at least some of the vias (e.g., TSV) 202 having exposed material on the interior surface of the ring frame. The pillars 210 can be capacitively coupled with the exposed via material 202.

It is understood that a circuit can measure impedances between any combination of pads 212 and any combination of pad to ground or other reference potential. In some embodiments, a total impedance of the pads 212 can be summed and stored. The impedance information can be stored for later comparison. Impedance information for at least one pad 212 can be referred to as an impedance fingerprint.

It will be appreciated that the impedance fingerprint for each package will be unique due to the inherent randomness of pillar formation, variation in the size of the conductive pads and vias due to manufacturing tolerance, and the variations in alignment due to assembly tolerances. Conductive pillars can be used as series capacitors between contact pads or vias where several pillars couple to each other to create a chain of capacitors. Conductive pillars can also be used as parallel capacitors, providing increased capacitance values. The combination of series and parallel capacitance is forms the fingerprint. An example is a capacitor in which all pillars directly contacting a conductor or TSV are in parallel, and any additional pillars between the conductor and a second conductor are in series. The number of pillars that are present in parallel or in series, and their physical arrangement is highly variable and unpredictable due to process variations.

In some embodiments, an impedance fingerprint for the package can be monitored to detect tampering. It is understood that tampering should be construed broadly to include any attempt to alter the physical structure of the package including deconstruction, reconstruction, and the like.

In embodiments, the pillars 210 and overall structure of the package is configured to render it difficult, if not impossible, to reassemble the package without changing at least the impedance fingerprint. For example, if an unauthorized party attempts to tamper with, e.g., take apart and reassemble, the IC package, at least some of the pillars will be broken or damaged so as to alter the pad-to-pad impedance in some way so that the impedance fingerprint is changed With this arrangement, tampering of the IC package can be detected.

It is understood that the vias, with exposed and non-exposed material, can be used for any practical type of connection, such as power, ground, signal, as well as impedance fingerprinting.

Figure 4:
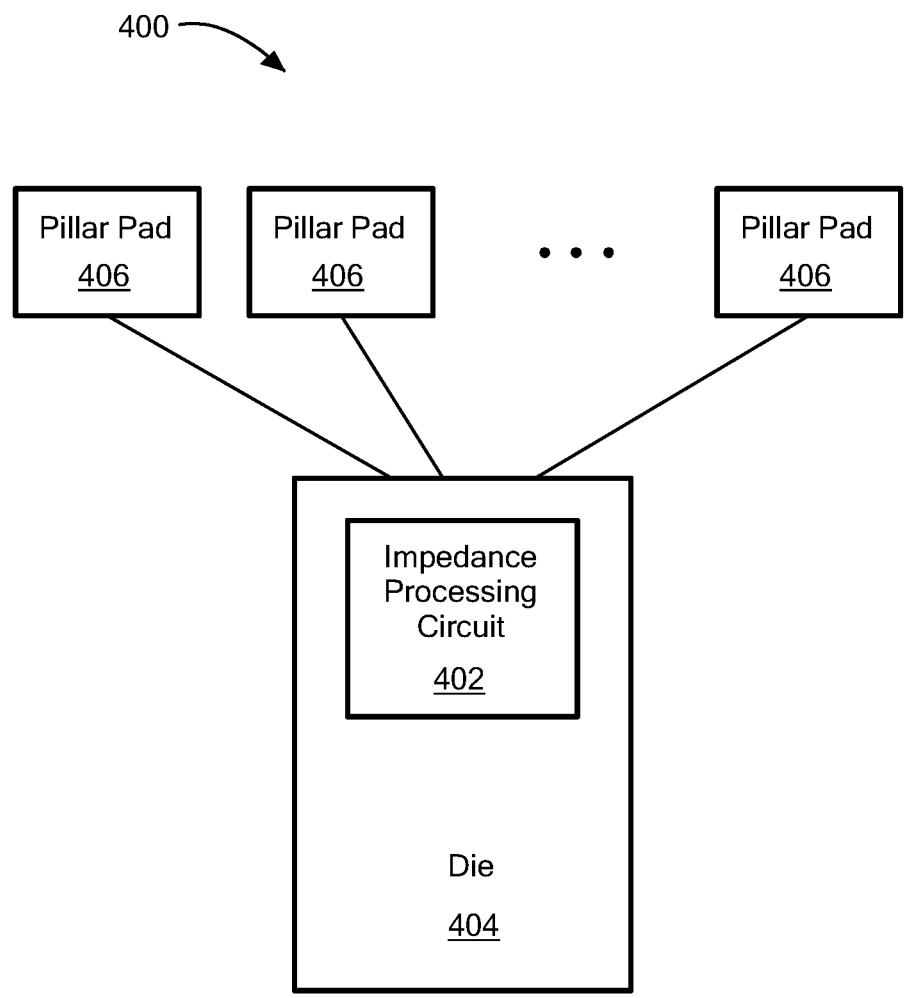
FIG. 4 is a schematic representation of a system having circuitry to process impedance information to detect tampering.

FIG. 4 shows an example package fingerprint system 400 having a signal processing circuit 402 in a die 404 for detecting tampering. As described above, the impedance, for example, for one or more pads 406, such as the pads 212 in FIG. 2A-2C, can be measured by the impedance processing circuit 402. Impedance, which can include capacitance, may be measured with respect to ground, to other pads, or to any reference node.

In another aspect, a die package includes at least one ring frame or one package layer with vias having exposed conductive via material on an exterior surface of the die package. An external device called an edge cap device can be attached to at least one contact on an exterior surface of the ring frame, package base, or package lid. The edge cap device can be an active or passive integrated circuit or it can comprise a passive structure or material that is electrically coupled to the die package. The electrical coupling may include (but not limited to) direct conductive or resistive contact, capacitive coupling, electromagnetic coupling, wireless communication, optical coupling, chemical coupling, or dielectric loading of a circuit to affect impedance. At least one edge cap can be coupled to the die package, such as an electrical connection to the exposed via material is made. In some embodiments, the electrical connections provide tamper detection functionality. In embodiments, the firmed electrical connections can provide layer-to-layer connections in addition to vias.

Figure 5A:
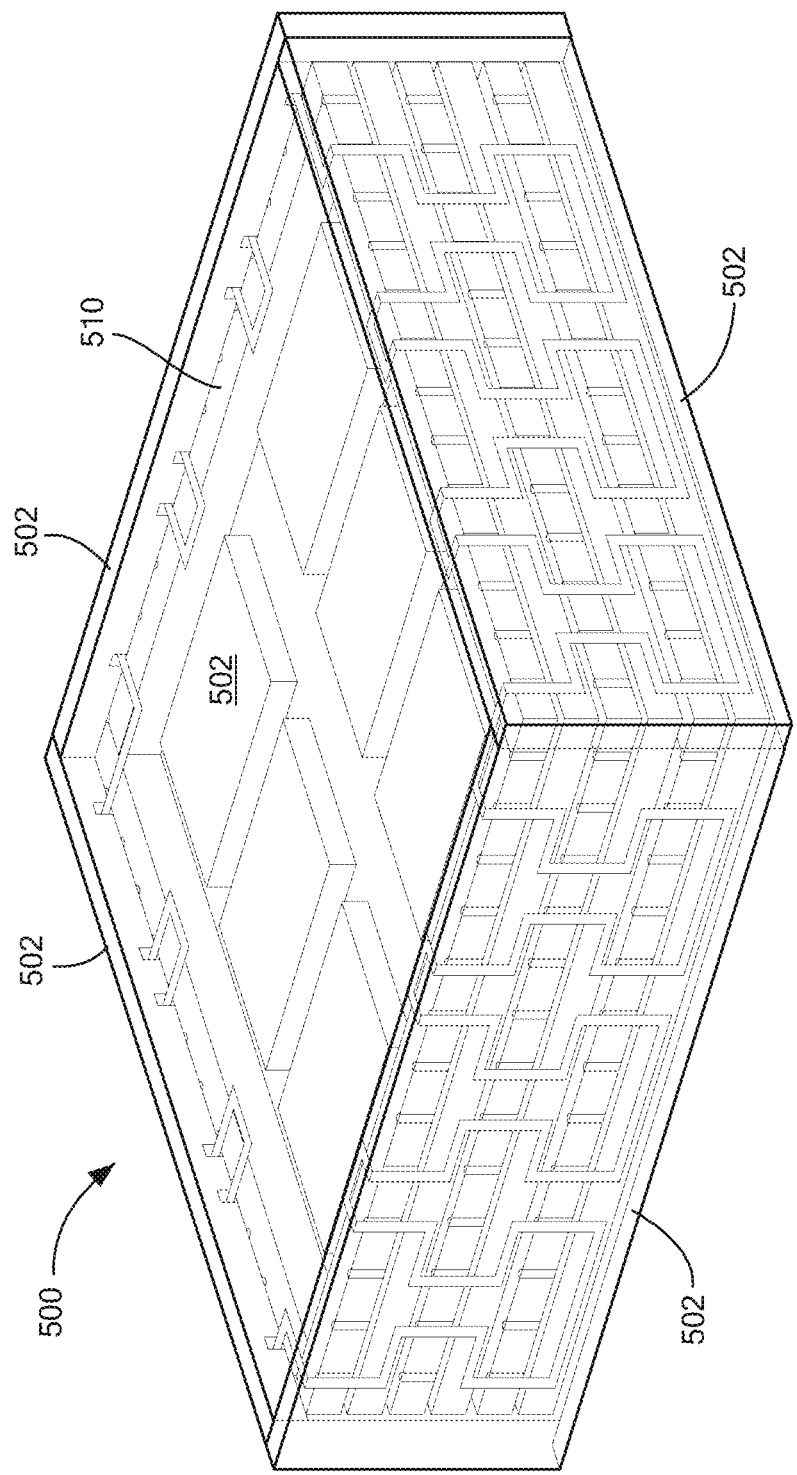
FIG. 5A is a partially transparent isometric view of an example die package having surrounded by edge caps to detect tampering.
Figure 5B:
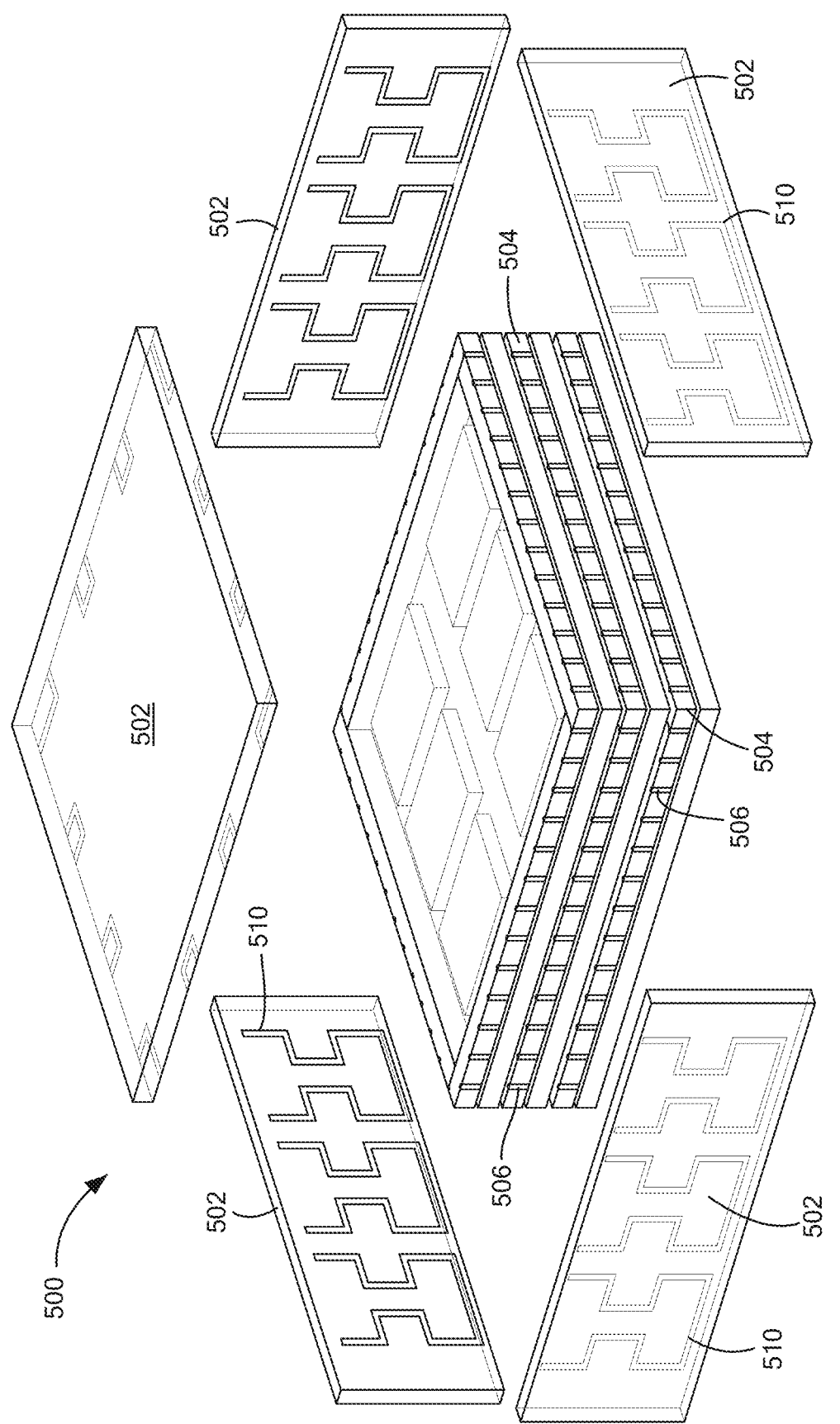
FIG. 5B is a partially exploded isometric view of the die package of FIG. 5A.

FIGS. 5A and 5B show an example die package 500 having edge caps 502 on five sides of the package. In other embodiments, a sixth edge cap can be underneath the package. In one embodiment, the die package 500 includes multiple levels each having a ring frame 504 with vias 506 that are exposed on an exterior surface of the ring frame. In embodiments, the die package may be at least partly similar to the die package of FIG. 1A.

Figure 5C:
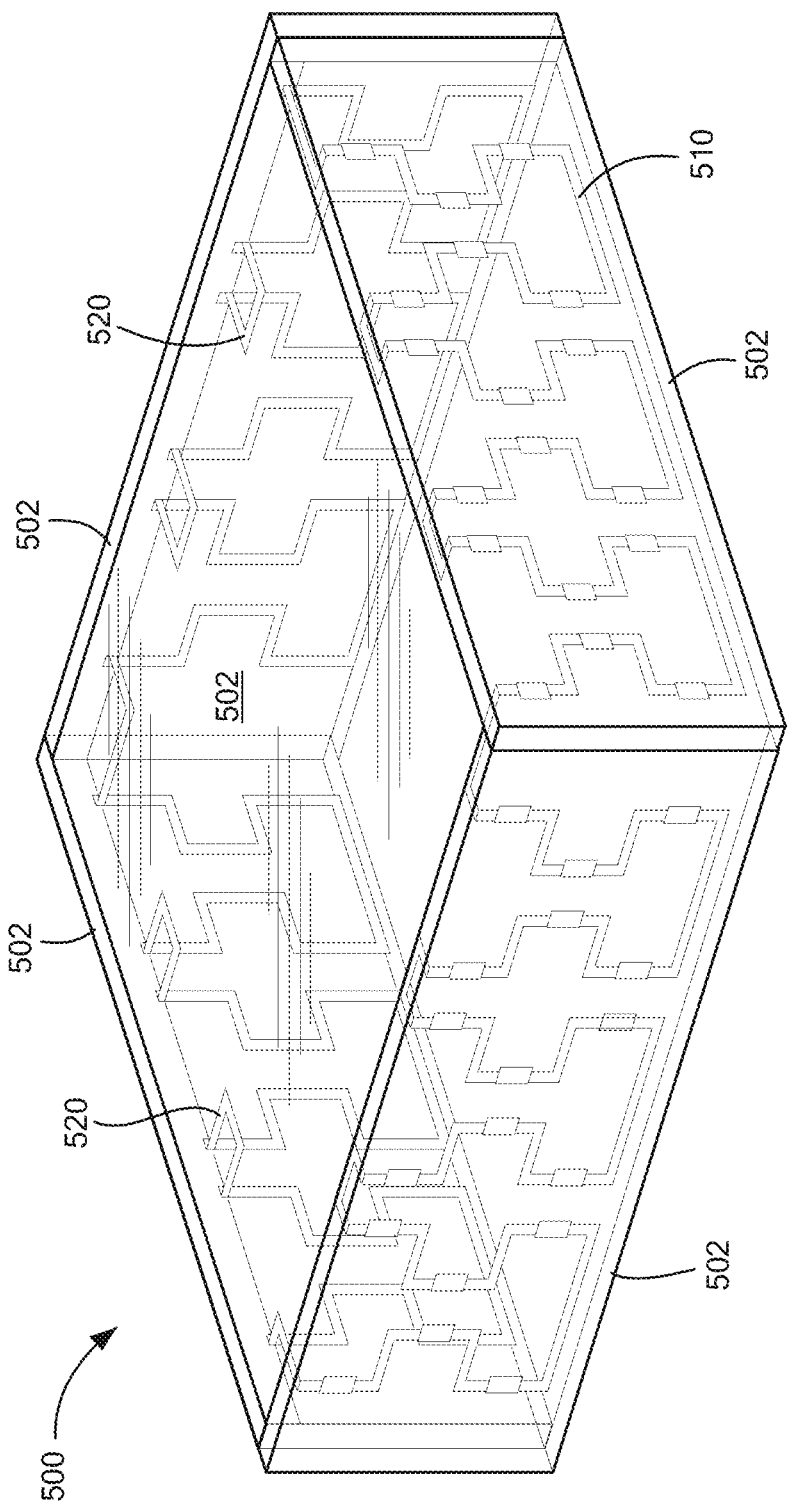
FIG. 5C is a partially transparent isometric view of circuit traces in the edge caps of FIG. 5A.

In embodiments, the edge caps 502 include a conductive trace 510 formed in a selected pattern to form desired connections with exposed vias 506. In some embodiments, edge caps 502 can surround the die package 500 so that the conductive traces 510 form a continuous electrical connection over the die package, as shown in FIG. 5C. A break in the continuous connection 510, which may comprise tampering, can be detected by circuity in a die of the package 500 or remote circuitry.

As shown in FIG. 5C, the conductive trace 510 can follow a pattern on each edge cap 502 that extends to an adjacent edge cap. A portion 520 of the trace 510 can extend onto a top of the package 500 so that, after assembly of the package and edge caps, any disassembly of the package can be detected by breakage of the trace.

Figure 5D:
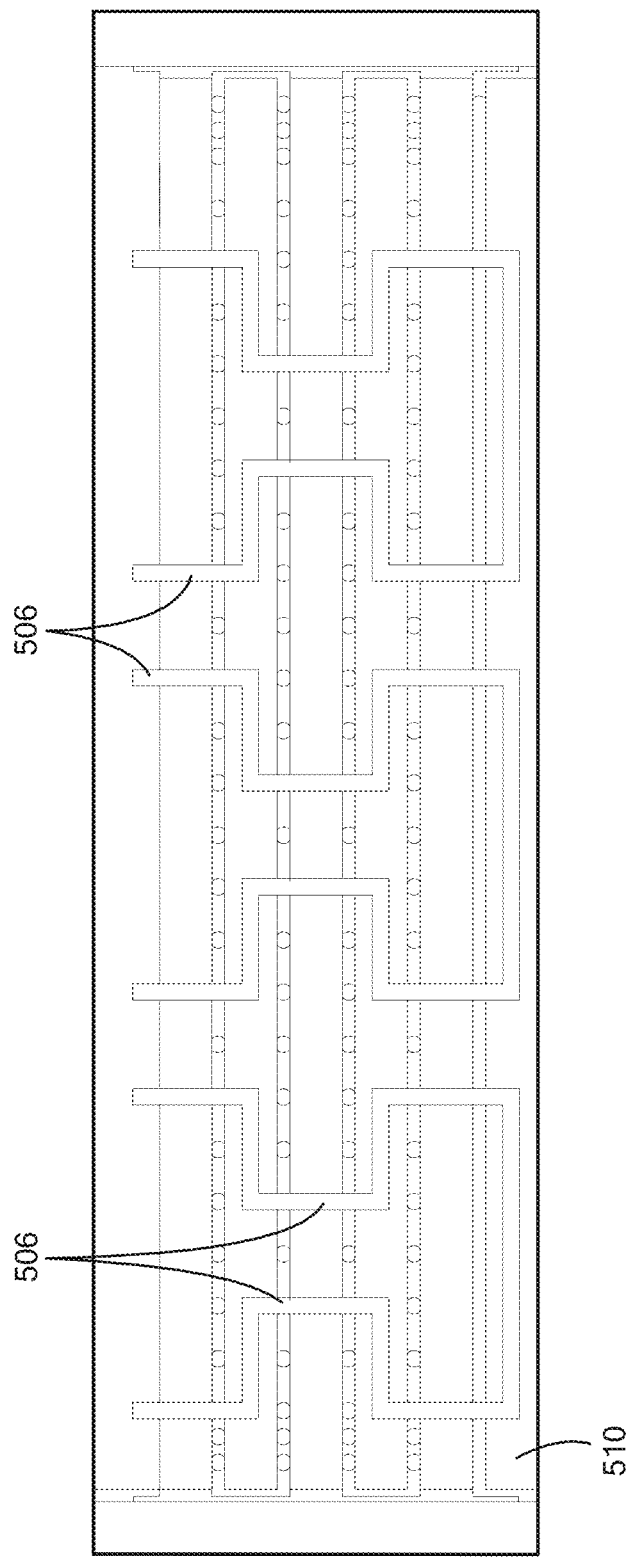
FIG. 5D is a partially transparent side view of circuit traces in the edge caps of FIG. 5A.

FIG. 5D shows alignment of the conductive trace 510 with exposed via 506 to form an electrical connection with the edge caps 502. By forming a connection to one or more vias 506, a path to a die in the protected volume of the package can be formed. Circuitry in the die can detect disassembly of the package. In addition, once disassembled, the edge caps 502 will not provide a continuous trace 510.

In a capacitive or dielectric embodiment of the edge cap circuit, the removal of the edge cap will result in an impedance or capacitance change in the die package circuit which can be detected. In a chemical or optical interface, the removal of the edge cap die results in a chemical change or optical change that can be detected by the die package circuit. In many of these cases, the interface between the edge cap and the die package includes a one-way function that is permanently altered if the interface between the edge cap and the die package is disturbed or the edge cap is removed.

In some embodiments, a circuit, such as the circuit 402 of FIG. 4, can inject a signal into the trace and measure signal characteristics. For example, a break in the trace 510 results in an open circuit that prevents current flow. In embodiments, any suitable signal or trace characteristic, such as impedance, voltage, current, capacitance, inductance, electromagnetic coupling, wireless communication, and optical communication and/or the like, can be measured to meet the needs of a particular application.

It is understood that one or more edge caps can be used to provide a security level to meet the needs of a particular application.

Figure 2D:
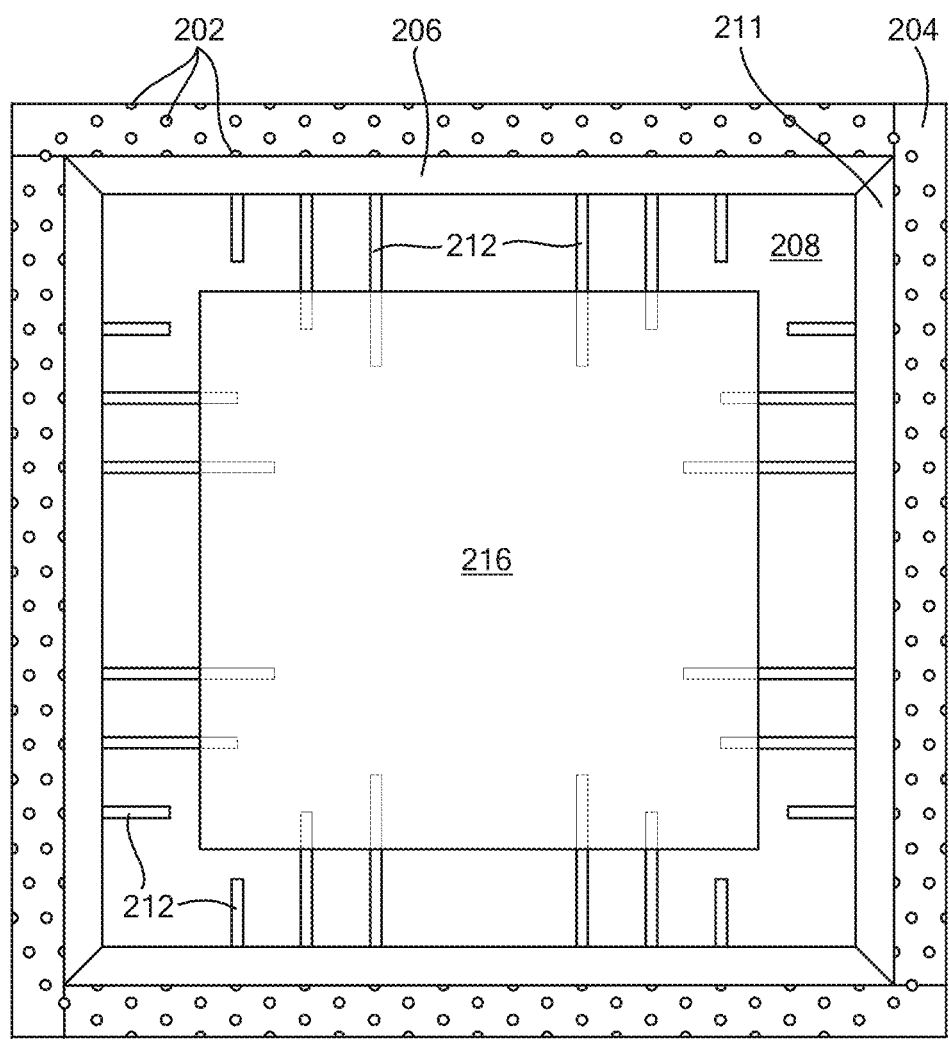
FIG. 2D is a top view of a die package having security features in accordance with example embodiments of the disclosure.
Figure 2E:
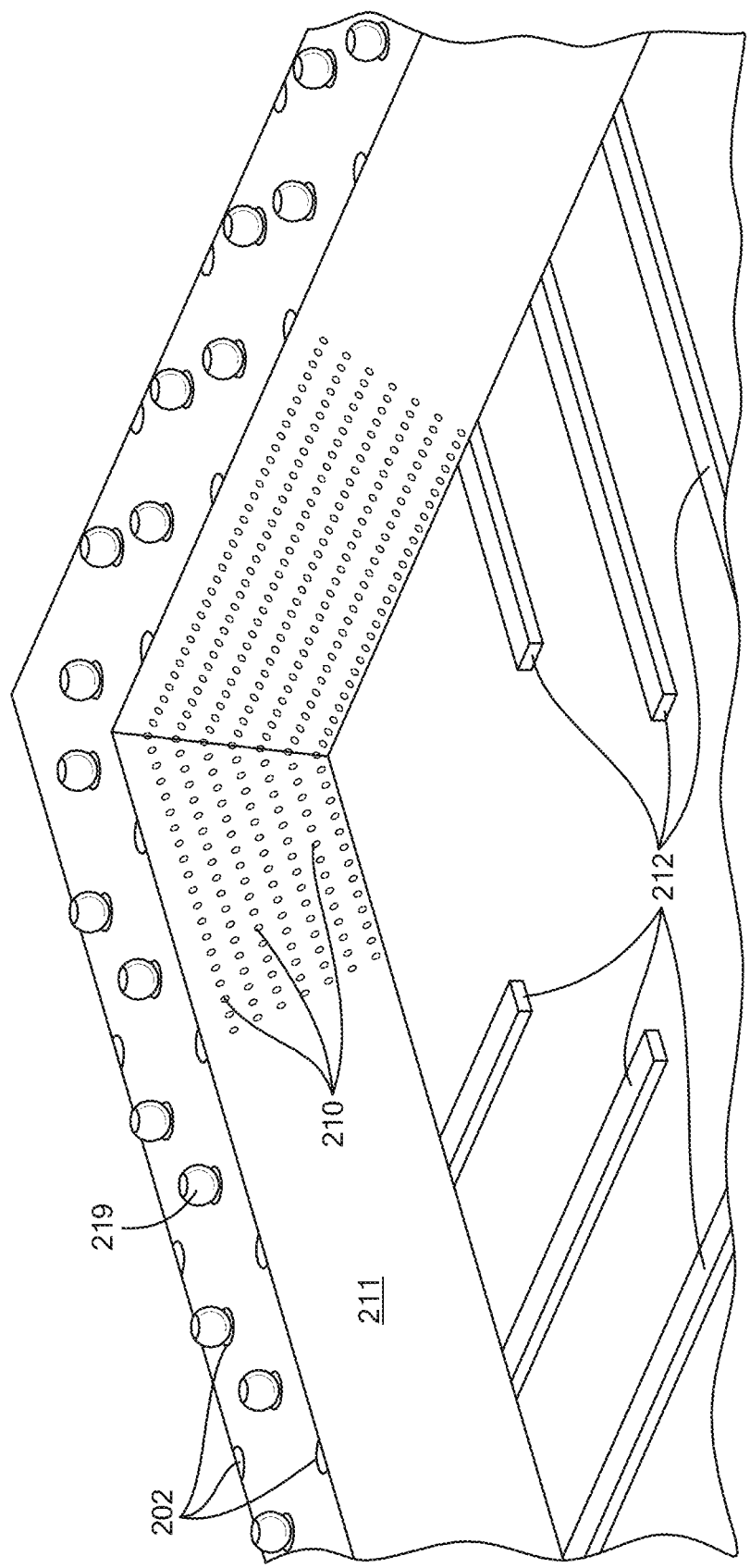
Figure 6A:
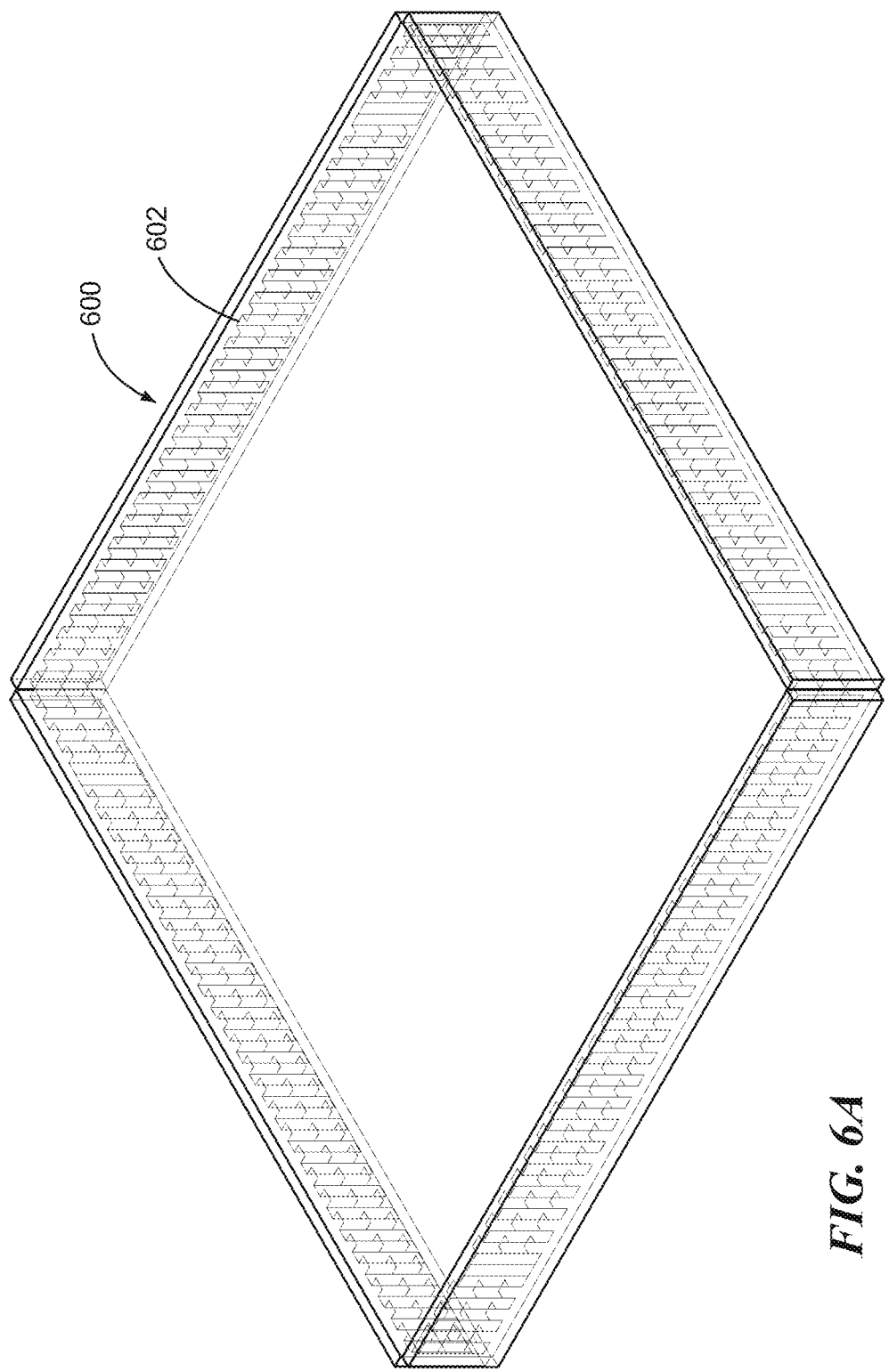
FIG. 6A is an isometric view and FIG. 6B is a top view of a die package having a conductive material around a perimeter.
Figure 6B:
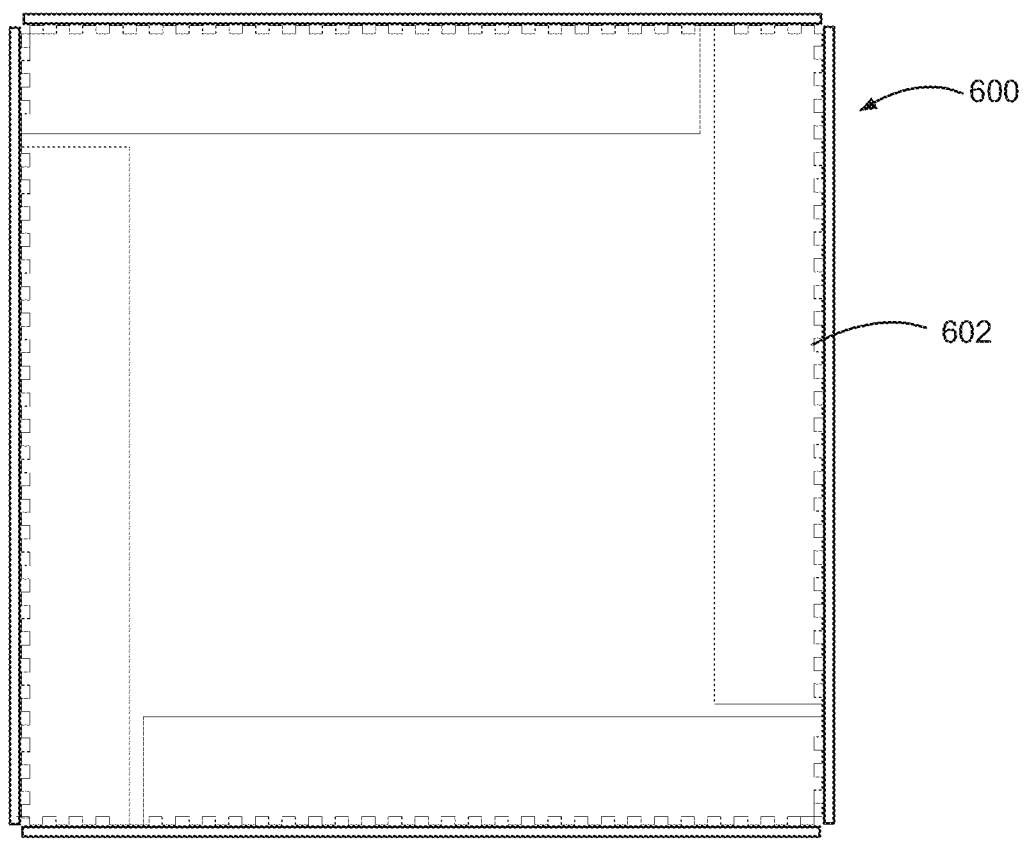

FIG. 6 shows an example die package 600, which may be similar to die package 200 of FIGS. 2A-2C, having a conductive mesh 602 around at least one face of the package for preventing signal radiation from the package during operation. The mesh 602 can be considered a Faraday cage to contain signals within the package.

In the illustrated embodiment, the mesh 602 includes gaps of a selected size that may correspond to an expected operating frequency of the circuitry in the die package.

It is understood that the mesh 602 can comprise any suitable conductive material having any practical geometry to meet the needs of a particular application. External mesh can comprise any conductive material and any size so long that the edge caps fully encompass the mesh. The mesh may also act as a shield from external electromagnetic fields, or contain electromagnetic fields of the devices within the package. Furthermore, the external circuitry mesh may be used to actively interfere with external electromagnetic sources such as receivers by sending a signal outward. One example includes a white noise generating circuit.

Figure 7A:
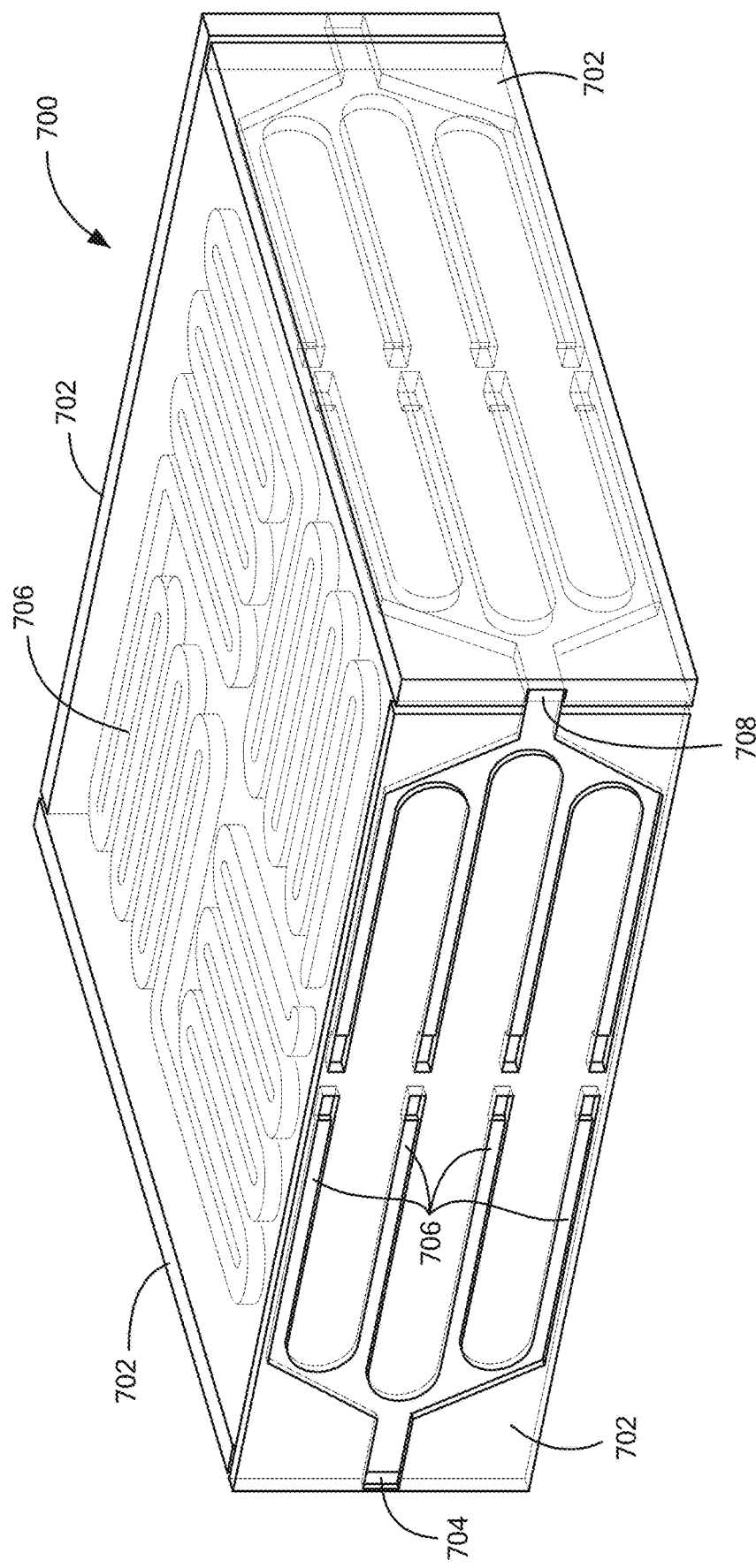
FIGS. 7A and 7B are partially transparent isometric views of a die package having cooling channels.
Figure 7B:
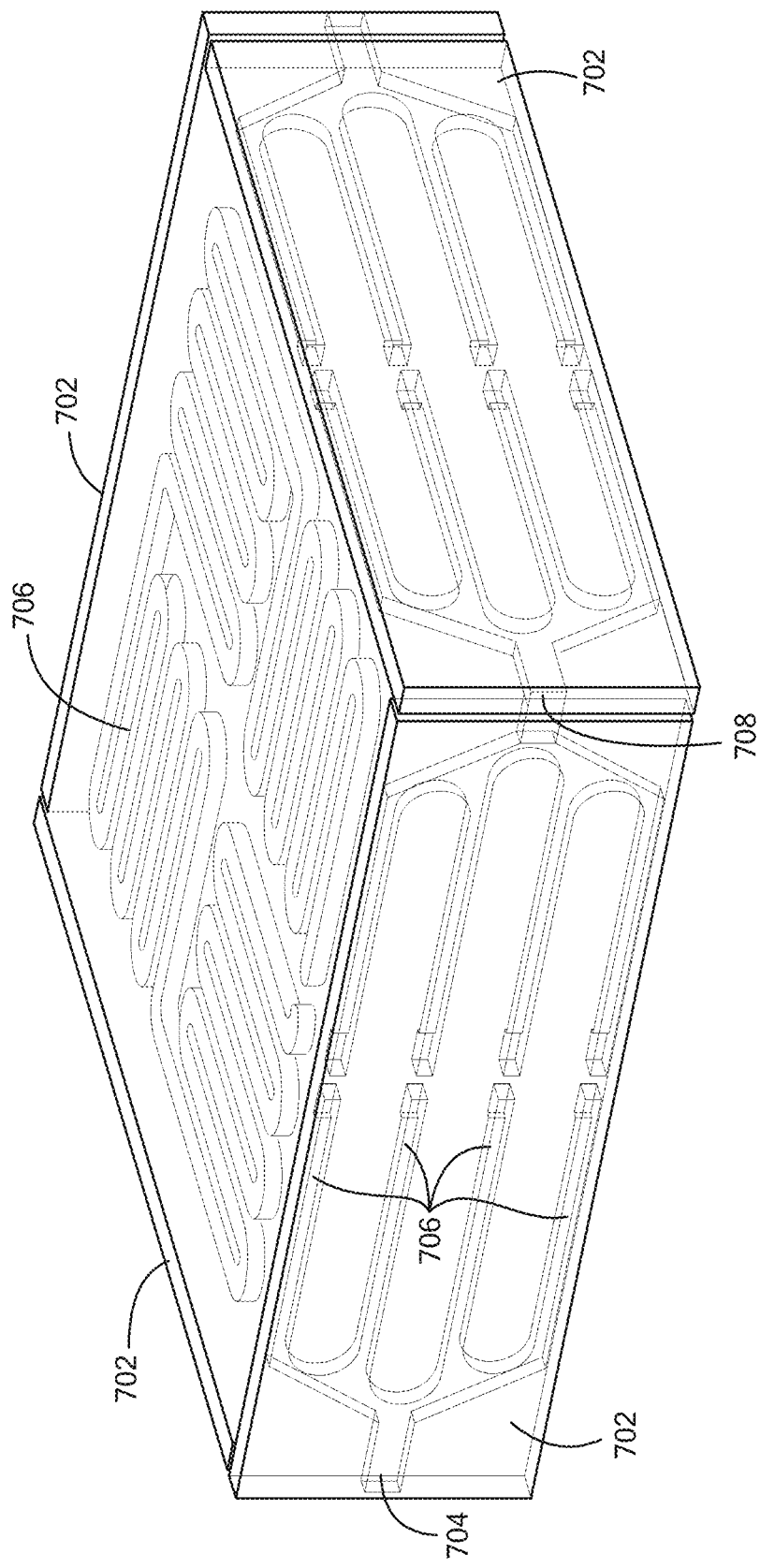

FIGS. 7A and 7B show an example die package 700 having edge caps 702 with coolant flow functionality. The die package 700 can include the pillars 210 of FIGS. 2A-2C and/or the edge caps 502 of FIGS. 5A and 5B with the addition of coolant channels.

In the illustrated embodiment, a fluid input port 704 can receive coolant that can flow through channels 706 in the edge caps 702. A fluid output port 708 can allow coolant exit.

Figure 7C:
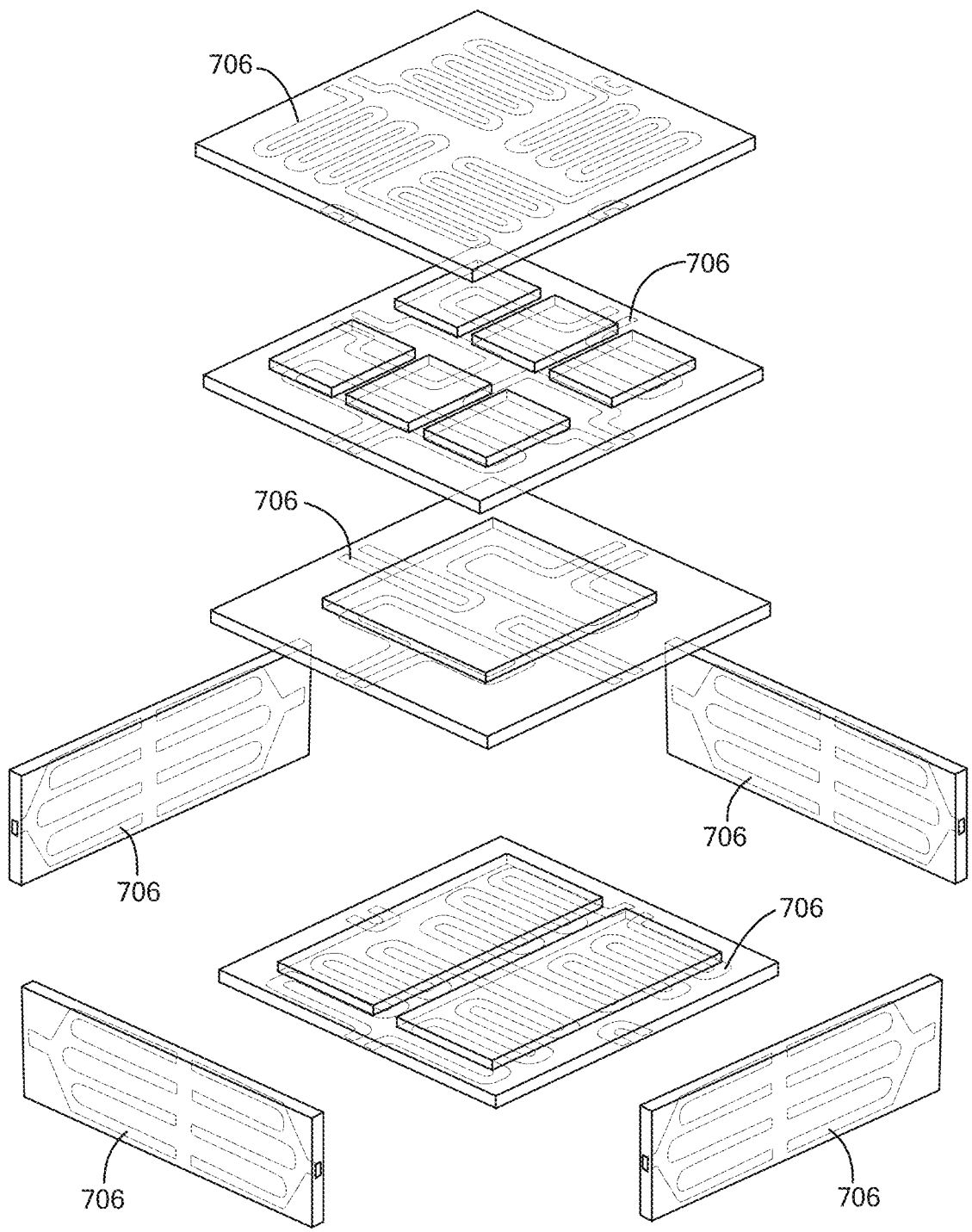
FIG. 7C is an exploded isometric view of a die package having cooling channels on package layers based on die thermal characteristics.

As shown in FIG. 7C, the fluid channels 706 can be tailored to a given die configuration. For example, it is known that processors have hot spots that generate heat in specific locations. The channels 706 can be configured to enhance cooling at certain die locations.

Figure 7D:
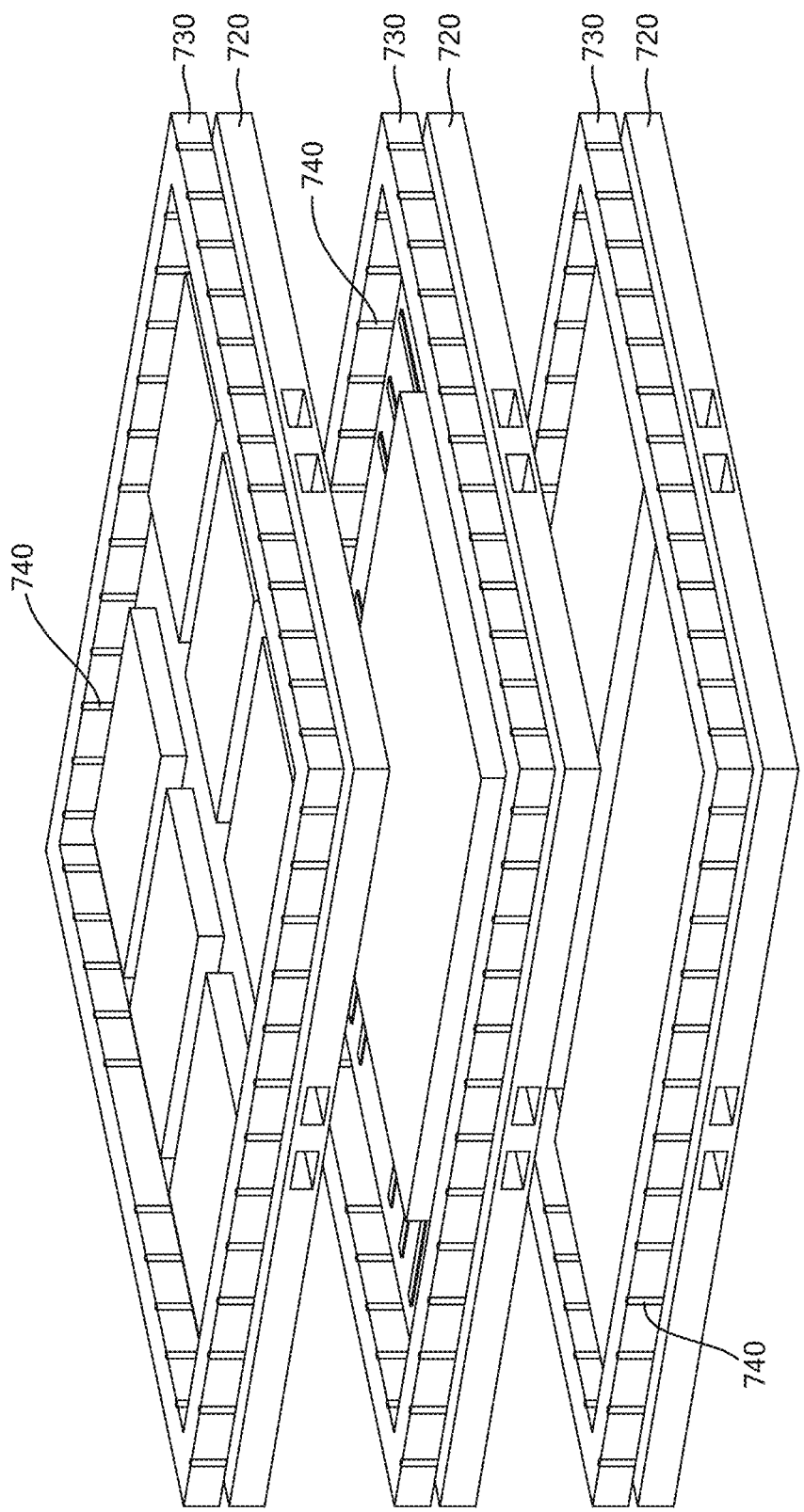
FIG. 7D is a partially exploded isometric view of a multilevel die package having coolant input and output ports.

As shown in FIG. 7D, base substrates 720 can include coolant input and output ports to allow coolant flow in channels formed in the base substrate. With this arrangement, coolant can flow internally within the die package proximate the die. FIG. 7D shows a ring frame 730, base substrate 720, via 740 and die configuration similar to that shown in FIG. 1A.

Figure 8:
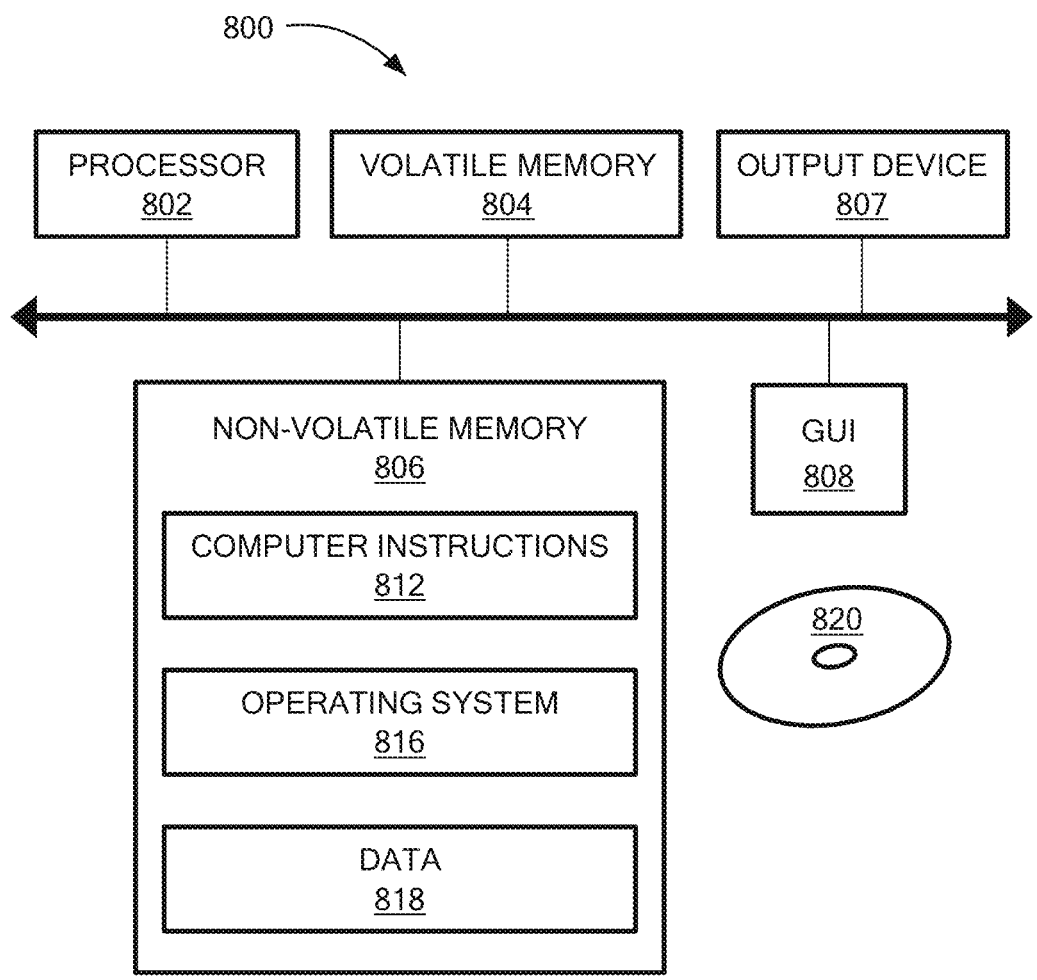
FIG. 8 is a schematic representation of an example computer that can perform at a least a portion of the processing described herein.

FIG. 8 shows an exemplary computer 800 that can perform at least part of the impedance signal measurement and processing described herein. For example, the computer 800 can perform signal processing in FIG. 4, for example. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), a general purpose graphical processing units (GPGPU), and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An assembly, comprising:
   a base substrate;
   a lid substrate;
   a ring frame connected to the base substrate and the lid substrate to define a protected volume, wherein the ring frame includes through vias that extend through the ring frame from a top of the ring frame to a bottom of the ring frame;
   a die contained in the protected volume,
   wherein at least some of the through vias in the ring frame have conductive material exposed on an outer surface of the ring frame, and further including:
   at least one edge cap coupled to at least one side of the assembly, wherein the at least one edge cap comprises a conductive trace in electrical contact with the exposed conductive material of at least one of the vias.

2. The assembly according to claim 1, further including electronic capacitive, resistive, and/or impedance-based sensor circuitry in the protected volume.

3. The assembly according to claim 2, wherein conductive particles form part of the sensor circuitry.

4. The assembly according to claim 2, wherein conductive pillars form part of the sensor circuitry.

5. The assembly according to claim 4, wherein the pillars extend from a pad supported by the base substrate.

6. The assembly according to claim 5, wherein the pad is coupled to the die.

7. The assembly according to claim 6, wherein the die comprises circuitry configured to determine an impedance of the pad and the pillars.

8. The assembly according to claim 4, wherein at least one of the vias in the ring frame has exposed via material conductively coupled with at least one of the pillars.

9. The assembly according to claim 4, wherein the pillars are formed from conductive particles in an anisotropic adhesive.

10. The assembly according to claim 4, wherein the pillars have heights defined by a mechanical fillet.

11. The assembly according to claim 6, wherein the pad and the pillars define an impedance fingerprint to detect tampering.

12. The assembly according to claim 11, wherein deconstruction of the assembly causes at least some of the pillars to break.

13. The assembly according to claim 1, wherein the at least one edge caps surround the assembly.

14. The assembly according to claim 13, wherein the at least one edge caps form an electronic sensing circuit which enables the assembly to detect tampering.

15. The assembly according to claim 14, wherein the die is configured to detect a discontinuity in the at least one edge cap electronic sensing circuit or barrier.

16. The assembly according to claim 15, wherein the assembly comprises at least three layers of the base substrate and the ring frame.

17. The assembly according to claim 1, wherein the at least one edge caps increase connections from layer-to-layer.

18. The assembly according to claim 1, wherein the at least one edge cap includes fluid channels to enable coolant flow.

19. The assembly according to claim 1, further including a conductive mesh around a perimeter of the ring frame.

* * * * *